(12) United States Patent
Segawa

(10) Patent No.: US 7,129,607 B2
(45) Date of Patent: Oct. 31, 2006

(54) MOTOR

(75) Inventor: Noboru Segawa, Tokyo (JP)

(73) Assignee: Nidec Copal Corporation, Tokyo (JP)

( * ) Notice: Subject to any disclaimer, the term of this patent is extended or adjusted under 35 U.S.C. 154(b) by 0 days.

(21) Appl. No.: 11/222,572

(22) Filed: Sep. 9, 2005

(65) Prior Publication Data

US 2006/0006750 A1    Jan. 12, 2006

Related U.S. Application Data

(60) Division of application No. 10/797,340, filed on Mar. 9, 2004, now Pat. No. 6,954,015, which is a continuation of application No. 09/787,932, filed as application No. PCT/JP00/04926 on Jul. 24, 2000, now Pat. No. 6,740,999.

(30) Foreign Application Priority Data

Jul. 23, 1999    (JP)    ................ P11-209184

(51) Int. Cl.
*H02K 7/065* (2006.01)
*H02K 7/06* (2006.01)

(52) U.S. Cl. .......................... 310/81; 310/71

(58) Field of Classification Search .......... 340/7.6
See application file for complete search history.

(56) References Cited

U.S. PATENT DOCUMENTS

| 5,801,466 | A | * | 9/1998 | Odagiri et al. ................ 310/81 |
| 5,943,214 | A | * | 8/1999 | Sato et al. ................... 361/752 |
| 5,986,367 | A |   | 11/1999 | Tsuzaki et al. |
| 5,986,368 | A |   | 11/1999 | Wetzel et al. |
| 6,081,055 | A |   | 6/2000 | Narusawa |
| 6,140,721 | A | * | 10/2000 | Ibata et al. ................ 310/67 R |
| 6,388,349 | B1 | * | 5/2002 | Ioka et al. .................... 310/81 |
| 6,542,381 | B1 | * | 4/2003 | Sei et al. .................... 361/801 |
| 6,628,025 | B1 |   | 9/2003 | Ibata et al. |

FOREIGN PATENT DOCUMENTS

| JP | 56-51460 | 5/1981 |
| JP | 62-23248 | 6/1987 |
| JP | 2-79170 | 6/1990 |
| JP | 5-11606 | 2/1993 |
| JP | 7-5271 | 1/1995 |
| JP | 7-203091 | 8/1995 |
| JP | 7-263091 | 10/1995 |
| JP | 08-321670 | 12/1996 |
| JP | 10/117460 | 5/1998 |
| JP | 11-25946 | 1/1999 |
| JP | 11-136327 | 5/1999 |
| JP | 11-136901 | 5/1999 |
| JP | 11-299165 | 10/1999 |

* cited by examiner

*Primary Examiner*—Burton Mullins
(74) *Attorney, Agent, or Firm*—Beyer Weaver & Thomas, LLP

(57) ABSTRACT

The present invention aims at providing a motor which can stably be mounted on a circuit board when being assembled into an instrument in particular. The motor 1 in accordance with the present invention comprises a motor body A, an output shaft 3 projecting from a front end of the motor body A, and a voltage-supplying terminal 8 provided in the motor body A, the terminal 8 having an elastic force in a direction substantially orthogonal to the output shaft 3 and also having a grounding portion 14 disposed near a rear end of the motor body A.

4 Claims, 4 Drawing Sheets

MOTOR

This application is a Divisional of application Ser. No. 10/797,340 filed Mar. 9, 2004 now U.S. Pat. No. 6,954,015 which is a Continuation of application Ser. No. 09/787,932, filed Mar. 21, 2001, now U.S. Pat. No. 6,740,999, which is the U.S. National Stage of PCT application Ser. No. PCT/JP00/04926 which was filed on Jul. 24, 2000, from which priority under 35 U.S.C. §120 is claimed. All of these applications are incorporated herein by reference.

TECHNICAL FIELD

The present invention relates to a motor; and, in particular, to a small-size motor which is built into a portable communications instrument (e.g., cellular phone) and is utilized as a source for generating vibrations for calling functions.

BACKGROUND ART

Conventionally known as techniques in such a field are those disclosed in Japanese Utility Model Publication No. SHO 62-23248 and Japanese Patent Application Laid-Open No. HEI 11-136901. The former publication proposes a technique in which, while a motor contact for supplying current to a motor brush has a flexibility, its elastic repulsive force is actively utilized. On the other hand, a small-Size motor 100 disclosed in the latter publication is made such that it is easily assembled into communications instruments such as a cellular phone. As shown in FIG. 6, the small-size motor 100 has an output shaft 103 to which a weight 104 is secured, whereas a forwardly extending electric terminal 102 is fixed at a barrel 100a of the small-size motor 100 by way of a bracket 105 and a holder 109. If such an electric terminal 102 made of a spring sheet is utilized, then no soldering is necessary when securing the motor 100 onto a circuit board 101, whereby the efficiency of production improves.

DISCLOSURE OF THE INVENTION

However, the above-mentioned conventional motors have a problem as follows. Namely, since the electric terminal 102 obliquely extends forward, the front end of the terminal 102 is grounded on the circuit board 101, whereby the motor 100 would be placed on the circuit board 101 in an unstable state in terms of its weight balance. In cases where the motor is built into other instruments such as a cellular phone in particular, it is necessary for a lid of the cellular phone or the like to press the motor 100 from thereabove. If its assembling operation is carried out in the unstable state shown in FIG. 6, however, then the motor 100 may move leftward in the drawing due to the pressure from the upper side (see the depicted arrow), whereby the terminal 102 may be detached from its predetermined electric contact 101a on the circuit board 101. That is, the motor 100 has a problem that it is not easily assembled into other instruments.

In order to overcome the above-mentioned problem, it is an object of the present invention to provide a motor which can stably be mounted on a circuit board when being assembled into an instrument in particular.

The motor in accordance with the present invention comprises a motor body, an output shaft projecting from a front end of the motor body, and a voltage-supplying terminal provided in the motor body, the terminal having an elastic force in a direction substantially orthogonal to the output shaft and also having a grounding portion disposed near a rear end of the motor body.

At the time of assembling a motor, the present invention intends to place the motor on a circuit board such that the grounding portion of its terminal comes into electric contact with a predetermined position on the circuit board. Namely, since the terminal has an elastic force, it is necessary for the motor to be stable on the circuit board when placed thereon. In the motor in accordance with the present invention, the grounding portion of the terminal is disposed near the rear end of the motor body so as to face the output shaft, whereby the motor attains a supporting balance on the circuit board, thus improving its stability. Also, from the viewpoint of keeping the rotational balance of the output shaft itself, which rotates at a high speed in front of the motor, it is quite meaningful to dispose the grounding portion of the terminal near the rear end of the motor body.

Preferably, in the above-mentioned motor, the terminal is formed by bending an elastic material and comprises a first portion extending substantially parallel to the output shaft from the motor body; a second portion extending substantially parallel to the first portion from a front end of the first portion by way of a bent part; and a third portion, formed with the grounding portion, projecting outward in a curved manner from a rear end of the second portion. When such a configuration is employed, the terminal can be formed with a simple structure at a low cost, whereby its cost of manufacture can be cut down.

Preferably, the above-mentioned motor further comprises a weight eccentrically secured to the output shaft. When such a configuration is employed, a vibrating motor can be constructed appropriately, whereby it becomes easier to assemble the motor into communications instruments such as a cellular phone.

The present invention will be more fully understood from the detailed description given hereinbelow and the accompanying drawings, which are given byway of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BEST MODE FOR CARRYING OUT THE INVENTION

Figure 1:
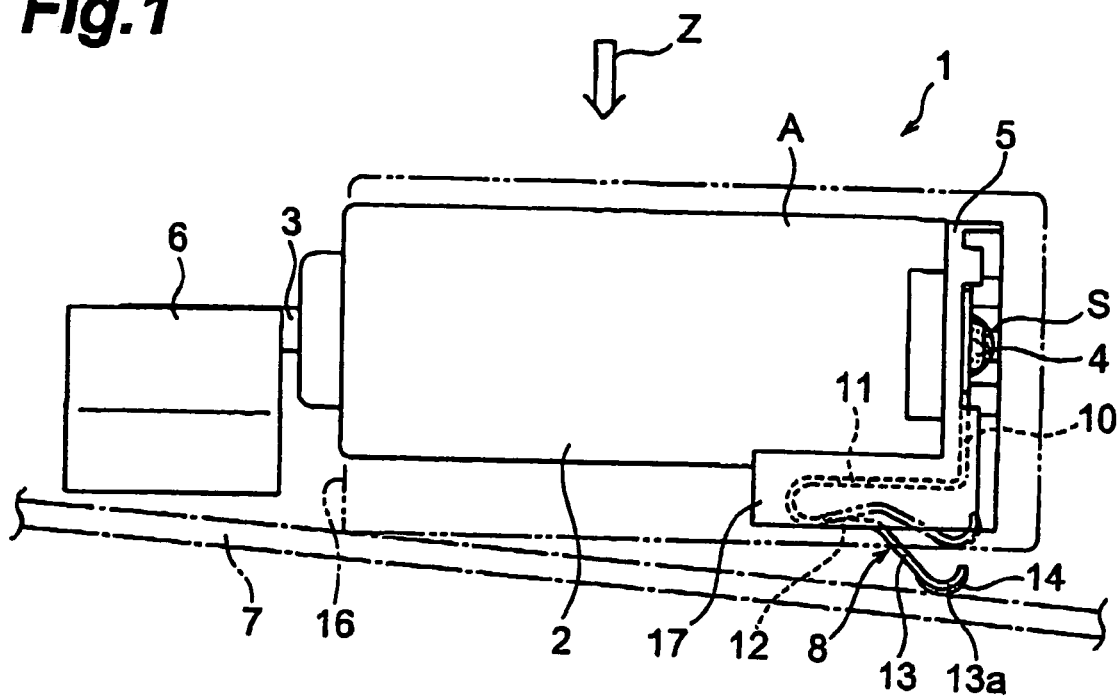
FIG. 1 is a side view showing an embodiment of the motor in accordance with the present invention.

In the following, a preferred embodiment of the motor in accordance with the present invention will be explained in detail with reference to the drawings.

As shown in FIGS. 1 to 4, a motor 1 comprises a cored motor, thereby attaining a smaller size. The motor 1 comprises a motor body A having a metal-made motor case (barrel) 2 with a diameter of about 4 mm and a length of about 10 mm. Secured to the inner wall face of the motor case 2 is a stator made of a permanent magnet having N and S poles. The motor case 2 contains therein a rotor comprising an iron core wound with a coil. Secured to the center of the rotor is an output shaft 3 supported with a bearing. The output shaft 3 extends such that its leading end portion penetrates through the front end portion of the motor case 2.

Secured to the rear end of the output shaft 3 is a commutator with which a pair of brushes are slidably in contact. Secured to each brush is a planar contact 4, whereas the rear end of each contact 4 projects from a bracket 5 secured to the rear end of the motor case 2. Also, a weight 6 having substantially a semicylindrical form is cramped onto or press-fitted into the leading end portion of the output shaft 3, so as to be eccentrically secured to the output shaft 3. As the eccentrically secured weight 6 rotates along with the rotation of the output shaft 3, the motor case 2 can be vibrated. Such a weight-equipped motor 1 is utilized for notifying a user of incoming calls in a pager, a cellular phone, or the like.

Here, the motor body A is provided with two terminals 8 for allowing the contacts 4 and their corresponding predetermined electric contacts in a circuit board 7 to electrically connect with each other upon a single motion. The terminals 8 are used for applying a predetermined external voltage to the brushes, and are disposed so as to correspond to their respective contacts 4. The base end of each terminal 8 is secured to its corresponding contact 4 with solder S. The terminal 8 is formed from a thin spring sheet, whereby the terminal 8 itself is provided with elasticity.

Figure 5:
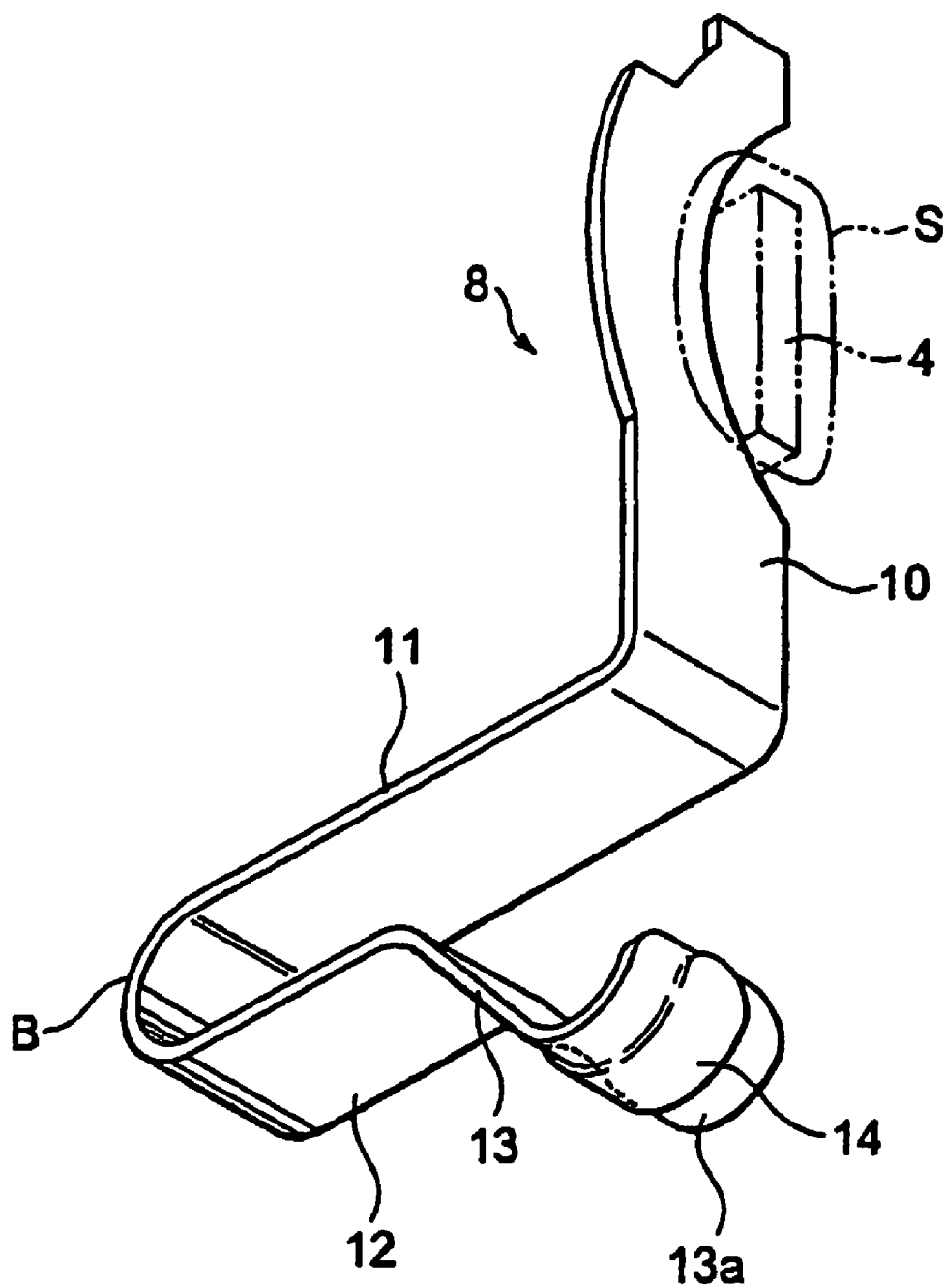
FIG. 5 is a perspective view showing a terminal employed in the motor of the present invention.
Figure 6:
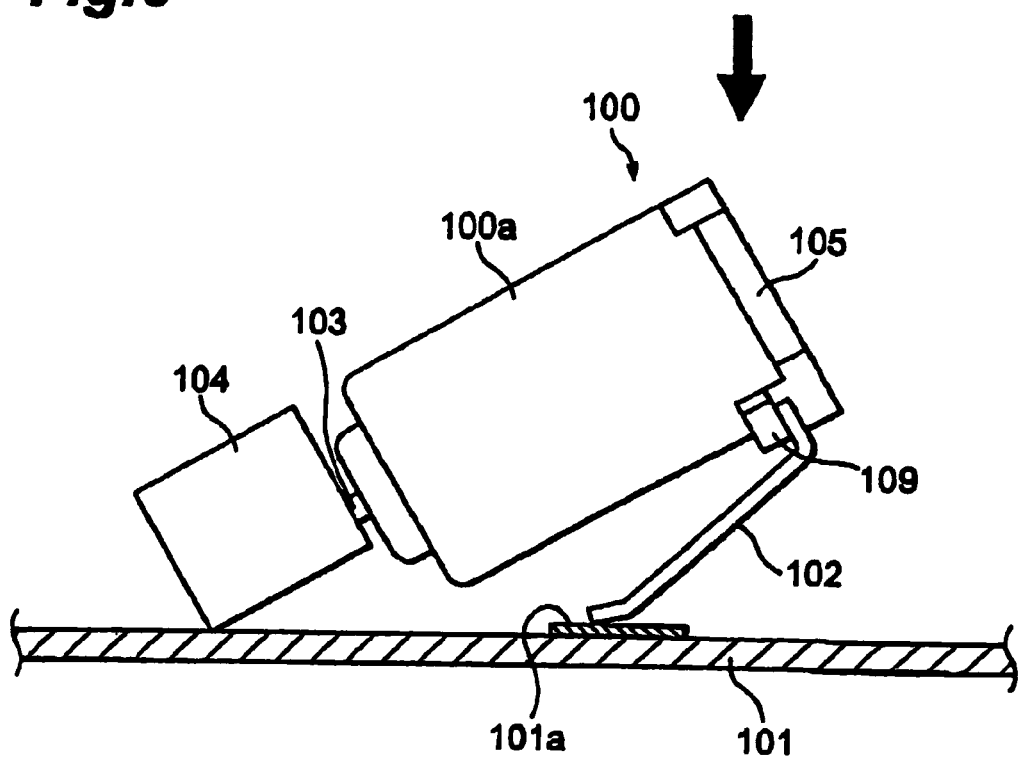
FIG. 6 is a side view showing a conventional motor.

The terminal 8 is formed by bending a thin spring. As shown in FIGS. 1 and 5, the terminal 9 has an attachment 10 to be secured to its corresponding contact 4 of the motor body A with the solder S, whereas the attachment 10 radially extends along an end face of the bracket 5. Further, the terminal 8 has a first portion 11 bent inward (toward the weight 6) at right angles at the lower end of the attachment 10. The first portion 11 extends substantially parallel to the output shaft 3 along the peripheral face of the motor case 2.

Also, the terminal 8 has a second portion 12 which extends substantially parallel to the first portion 11 by way of a bent part B at which the front end of the first portion 11 is bent into a U-shape. The second portion 12 extends up to about a half of the first portion 11. The terminal 8 has a third portion 13 which is bent so as to project outward from the rear end of the second portion 12. Further, the rear end of the third portion 13 is formed with a curved part 13a having a top area formed with a grounding portion 14 whose surface is plated with Au. The grounding portion 14 ensures electric connection between the terminal 8 and its corresponding predetermined electric contact in the circuit board 7. Employing the terminal 8 thus formed by bending a spring sheet enables the terminal to be formed with a simple structure at a low cost, whereby the cost of manufacture would eventually be cut down.

Figure 2:
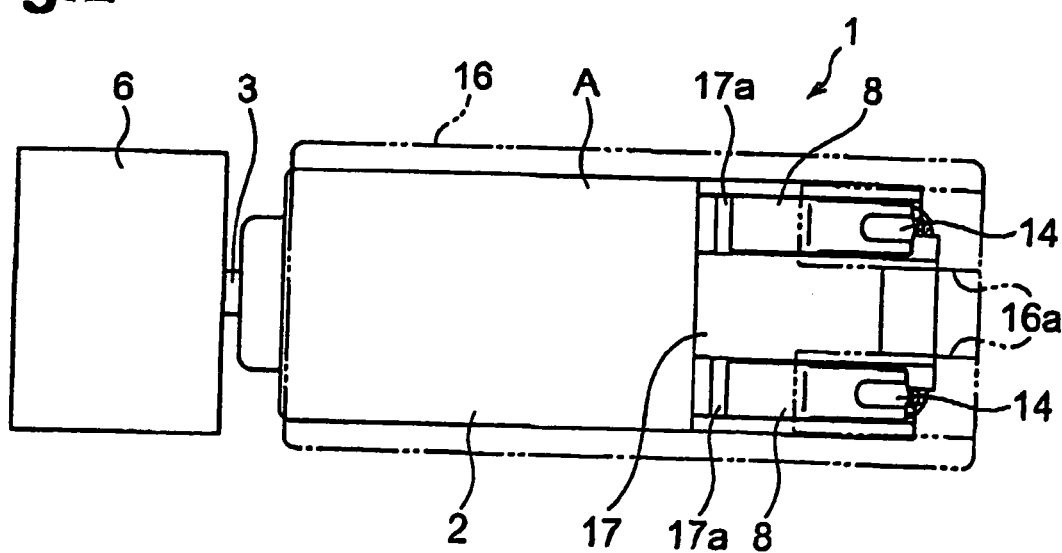
FIG. 2 is a bottom view of the motor shown in FIG. 1.

Also, the terminal 8 is contained in a slit 17a of a leg 17 disposed near the rear end of the motor case 2 (see FIG. 2). Here, the third portion 13 of the terminal 8 is exposed from the slit 17a. As a consequence, without exposing the whole terminal 8, which is likely to be damaged, the part necessary for electric junction can be inspected visually, whereby the motor 1 can easily be assembled into other instruments.

Due to the foregoing configuration, the terminal 8 has a resilient force in a direction substantially orthogonal to the output shaft 3, while the grounding portion 14 of the terminal 8 is disposed on the motor case 2 (barrel) side of the motor body A near the rear end thereof.

Consequently, as shown in FIG. 1, such an assembling operation is possible in which, while the motor 1 is disposed on the circuit board 7 and held in this state, a lid of an unshown instrument or the like presses the motor 1 from thereabove in the direction of arrow Z. In this case, the terminal 8 elastically deforms as indicated by the dash-double-dot line in FIG. 1, so as to be pressed against the circuit board 7, whereby the grounding portion 14 of the terminal 8 and its corresponding electric contact are reliably connected to each other.

Also, when the motor 1 is placed on the circuit board 7 upon assembling the motor 1 into an instrument such as a cellular phone, the terminal 8 deforms, due to the weight of motor 1 and the weight 6, such that the third portion 13 approaches the first portion 11. Thus, if the grounding portion 14 of the terminal 8 is disposed near the rear end of the motor body A so as to face the output shaft 3, the supporting balance of the motor 1 on the circuit board 7 can be made better, whereby the stability of the motor 1 becomes quite favorable. Also, from the view point of keeping the rotational balance of the output shaft 3 itself, which rotates at a high speed in front of the motor 1, it is quite meaningful to dispose the grounding portion 14 of the terminal 8 near the rear end of the motor body A.

Figure 3:
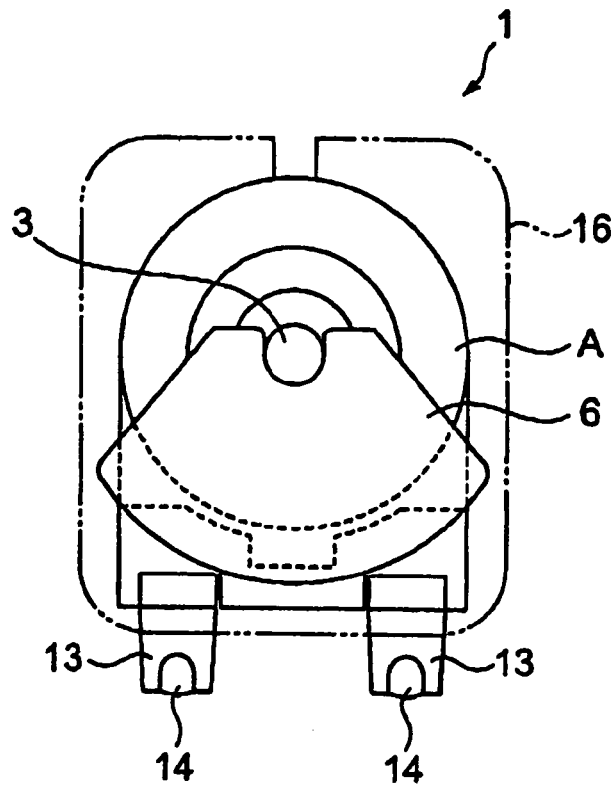
FIG. 3 is a front view of the motor shown in FIG. 1.
Figure 4:
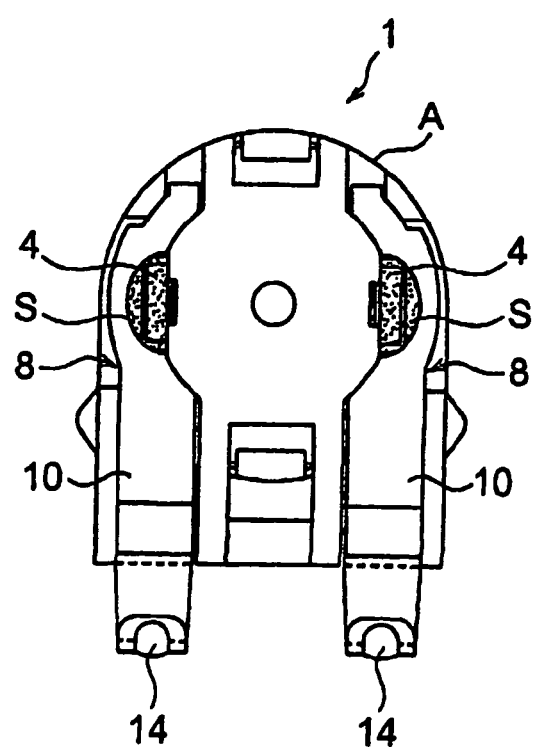
FIG. 4 is a rear view of the motor shown in FIG. 1.

On the other hand, the motor body A is covered with a rubber-made holder 16 as indicated by the dash-double-dot lines in FIGS. 2 and 3. Consequently, when the motor 1 vibrates along with the rotation of the weight 6, unnecessary vibrating sounds wound not occur from the housing of the instrument. Here, the third portion 13 of the terminal 8 is exposed to the outside by way of a slit-like groove 16a formed in the holder 16.

Since the motor in accordance with the present invention is configured as in the foregoing, it attains effects as follows. Namely, since the motor comprises a motor body, an output shaft projecting from a front end of the motor body, and a voltage-supplying terminal provided in the motor body, whereas the terminal has an elastic force in a direction substantially orthogonal to the output shaft and also has a grounding portion disposed near a rear end of the motor body, the motor can stably be mounted on a circuit board when being assembled into an instrument.

INDUSTRIAL APPLICABILITY

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The invention claimed is:

1. A communications instrument comprising:
a printed circuit board having an electrical contact;
a lid positioned over the printed circuit board;
a vibrating motor assembly including a motor body having a front end and a back end, an output shaft and an electrical terminal, the electrical terminal including:
a first portion adjacent to the back end of the motor body and arranged adjacent a side of the motor body;

a second portion outwardly bent from a free end of the first portion, the second portion facing the first portion with a predetermined distance; and a contact provided in the second portion and adapted to contact the electrical contact of the printed circuit board, wherein when the vibrating motor assembly is pressed between the lid and the printed circuit board, the second portion is elastically moved toward the motor body so that the contact on the second portion applies elastic force toward the electrical contact of the printed circuit board.

2. A communications instrument according to claim 1, wherein the elastic force applied by the contact portion of the terminal is substantially perpendicular to the output shaft.

3. A communications instrument according to claim 1, wherein the communication instrument is a cellular phone.

4. A communications instrument according to claim 1, wherein the communications instrument is a pager.

* * * * *